(12) United States Patent
Yoon et al.

(10) Patent No.: US 8,558,263 B2
(45) Date of Patent: Oct. 15, 2013

(54) NITRIDE SEMICONDUCTOR LIGHT-EMITTING DEVICE HAVING HIGH LIGHT EFFICIENCY AND METHOD OF MANUFACTURING THE SAME

(75) Inventors: Suk-ho Yoon, Seoul (KR); Cheol-soo Sone, Anyang-si (KR)

(73) Assignee: Samsung Electronics Co., Ltd, Suwon-Si, Gyeonggi-Do (KR)

( * ) Notice: Subject to any disclaimer, the term of this patent is extended or adjusted under 35 U.S.C. 154(b) by 123 days.

(21) Appl. No.: 13/159,993

(22) Filed: Jun. 14, 2011

(65) Prior Publication Data

US 2011/0248306 A1 Oct. 13, 2011

Related U.S. Application Data

(62) Division of application No. 11/318,615, filed on Dec. 28, 2005, now Pat. No. 7,981,775.

(30) Foreign Application Priority Data

Dec. 28, 2004 (KR) ........................ 10-2004-0114343

(51) Int. Cl.
*H01L 33/00* (2010.01)

(52) U.S. Cl.
USPC ..................................... 257/98; 257/E33.074

(58) Field of Classification Search
USPC ............................................ 257/98, E33.074
See application file for complete search history.

(56) References Cited

U.S. PATENT DOCUMENTS

| | | | |
|---|---|---|---|
| 3,503,798 A | 3/1970 | Yoshioka et al. | |
| 5,900,650 A | 5/1999 | Nitta | |
| 6,015,979 A | 1/2000 | Sugiura et al. | |
| 6,325,850 B1 | 12/2001 | Beaumont et al. | |
| 6,441,403 B1 | 8/2002 | Chang et al. | |
| 6,847,057 B1 | 1/2005 | Gardner et al. | |
| 2003/0138983 A1 | 7/2003 | Biwa et al. | |
| 2004/0239239 A1* | 12/2004 | Fukase | 313/506 |
| 2006/0266281 A1 | 11/2006 | Beaumont et al. | |

FOREIGN PATENT DOCUMENTS

| | | |
|---|---|---|
| KR | 89-5899 | 5/1989 |
| KR | 10-2004-0042311 A | 5/2004 |

OTHER PUBLICATIONS

Yang, Chiao-Chih et al.; "Improvement in Extraction Efficiency of GaN-Based Light-Emitting Diodes with Textured Surface Layer by Natural Lithography"; Apr. 21, 2005; Japanese Journal of Applied Physics, vol. 44, No. 4B, pp. 2525-2527.*
Korean Office Action for Application No. 10-2004-0114343, issued on Apr. 22, 2006.

* cited by examiner

*Primary Examiner* — Stephen W Smoot
*Assistant Examiner* — Vicki B Booker
(74) *Attorney, Agent, or Firm* — Buchanan Ingersoll & Rooney PC

(57) ABSTRACT

Provided is a nitride semiconductor light emitting diode and a method of manufacturing the same. The method includes sequentially forming a first semiconductor layer, an active layer, and a second semiconductor layer on a substrate, in-situ depositing a mask layer on a region of the surface of the second semiconductor layer, and selectively growing a third semiconductor layer formed in a textured structure on the second semiconductor layer by depositing a semiconductor material on the second semiconductor layer and the mask layer.

6 Claims, 5 Drawing Sheets

NITRIDE SEMICONDUCTOR LIGHT-EMITTING DEVICE HAVING HIGH LIGHT EFFICIENCY AND METHOD OF MANUFACTURING THE SAME

CROSS-REFERENCE TO RELATED PATENT APPLICATION

This application is a divisional application of U.S. application Ser. No. 11/318,615 filed Dec. 28, 2005, and which claims to priority to Korean Patent Application No. 10-2004-0114343 filed on Dec. 28, 2004, the entire contents of which is incorporated herein by reference.

BACKGROUND OF THE INVENTION

1. Field of the Invention

The present invention relates to a semiconductor light emitting device, and more particularly, to a nitride semiconductor light emitting device that improves light extraction efficiency using a textured structure formed in-situ on a semiconductor layer of a nitride semiconductor structure, and a method of manufacturing the same.

2. Description of the Related Art

A light emitting diode (LED) is a device used for converting electrical energy to infra red rays, visible light, or other light using the characteristics of a compound semiconductor. The transformation of the electrical energy into optical energy can be divided into heat radiation and luminescence. The luminescence includes photoluminescence according to excitation by light, cathode luminescence generated by scanning X-rays or an electron beam, and electroluminescence (EL). Here, the light emitting diode is a kind of EL device, and presently, the most widely used light emitting diodes employ an III-V group compound semiconductor.

The III-V group compound semiconductor is a direct transition semiconductor, and is widely used for the LED or a laser diode (LD) since it provides stable operation at a higher temperature than other semiconductors. The III-V group compound semiconductor is typically formed on a substrate formed of sapphire $Al_2O_3$ or SiC. To improve the light emission efficiency, or light extraction efficiency, a variety of LED structures have been studied. One of these is a textured structure on a semiconductor layer on an upper part of an active layer of the LED.

FIGS. 1A and 1B are schematic drawings illustrating light paths at an interface of material layers having different refractive indexes. In FIG. 1A, the material layer has a flat interface, and in FIG. 1B, the material layer has a textured structure interface.

Referring to FIG. 1A, light passing from a first material layer 11 having a greater refractive index into an air layer 12 having a smaller refractive index (n=1) must enter a flat interface 13a at at least a predetermined angle. If the light enters at a smaller angle, the light is totally internally reflected at the flat interface 13a, resulting in the reduction of the light extraction efficiency. To avoid the total internal reflection of light, a method of using a non-flat interface has been attempted.

Referring to FIG. 1B, a non-flat interface, i.e. a textured structure interface 13b, is formed between the first material layer 11 and the air layer 12. Accordingly, the light has an angle of incidence greater than the predetermined angle at the textured structure interface 13b where the light passes from the first material layer 11 into the air layer 12. Thus, the extraction efficiency of light can be improved.

FIG. 2A is a cross-sectional view of a conventional LED having the textured structure as described above. A p-electrode 22, a p-GaN layer 23, an InGaN active layer 24, an n-GaN layer 25, and an n-electrode 26 are sequentially formed on a lower structure 21. Here, the textured structure 27 is formed on the surface of the n-GaN layer 25. The textured structure 27 is formed to control the incidence angle for best extraction of light generated by the active layer 24 into the air layer through the n-GaN layer 25, since GaN has a greater refractive index (n=2.5) than the air layer (n=1). FIG. 2B is a SEM image of the textured structure 27, which is formed of a material such as $H_3PO_4$ by wet etching.

However, in the conventional art, to form the textured structure 27, a chemical etching process must be additionally performed after a process for forming a semiconductor LED. Therefore, the manufacturing process is complicated, and productivity is reduced.

SUMMARY OF THE INVENTION

Exemplary embodiments of the present invention provides a method of manufacturing a semiconductor light emitting diode having a textured structure for improving light extraction efficiency, wherein a process for manufacturing the semiconductor light emitting diode and a process for forming the textured structure are performed in-situ.

According to an aspect of the present invention, there is provided a method of manufacturing a semiconductor light emitting diode, comprising: sequentially forming a first semiconductor layer, an active layer, and a second semiconductor layer on a substrate; in-situ depositing a mask layer on a region of the surface of the second semiconductor layer; and selectively growing a third semiconductor layer formed in a textured structure on the second semiconductor layer by depositing a semiconductor material on the second semiconductor layer and the mask layer.

The in-situ depositing of a mask layer on a region of the surface of the second semiconductor layer may comprise forming the mask layer by adding a Si source and an N source to the second semiconductor layer.

The Si source may comprise at least one of silicon source such as triethylsilane (TESi), tributhy silane (TBSi), ditertiarybuthysilane (DTBSI) or silicon hydride sources such as silane ($SiH_4$), disilane ($Si_2H_6$), TESi, TBSi, $SiH_4$, or $Si_2H_6$.

The N source may be $NH_3$.

The first semiconductor layer may be formed of an n-type semiconductor material, and the second semiconductor layer may be formed of a p-type semiconductor material.

According to another aspect of the present invention, there is provided a semiconductor light emitting diode having a first semiconductor layer, an active layer, and a second semiconductor layer, comprising: a mask layer formed on the second semiconductor layer; and a third semiconductor layer formed in a textured structure on a surface of the second semiconductor layer on which the mask layer is not formed.

The mask layer may be formed of a material that includes $Si_xN_y$.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown.

Figure 3A:
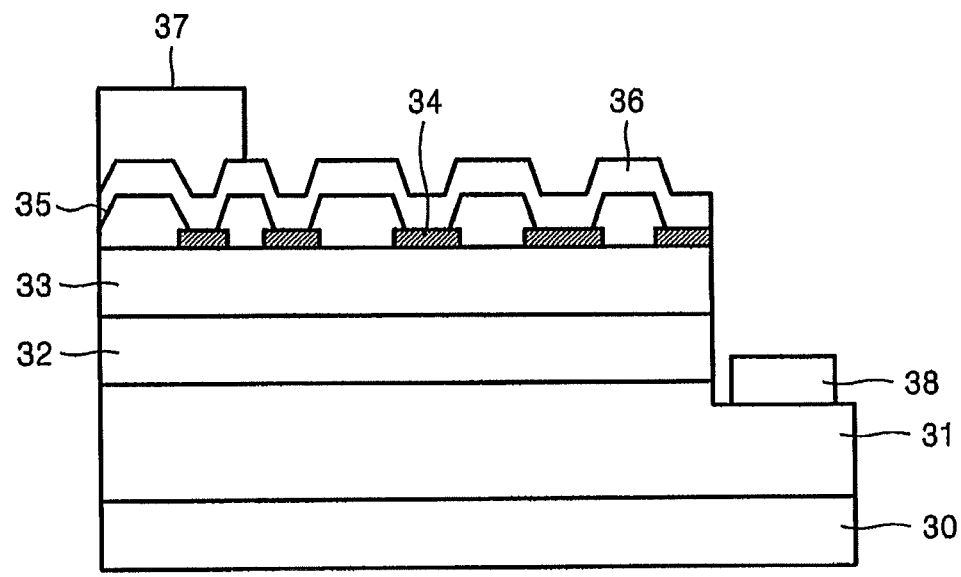
FIG. 3A is cross-sectional view of a nitride semiconductor LED according to an embodiment of the present invention.
Figure 3B:
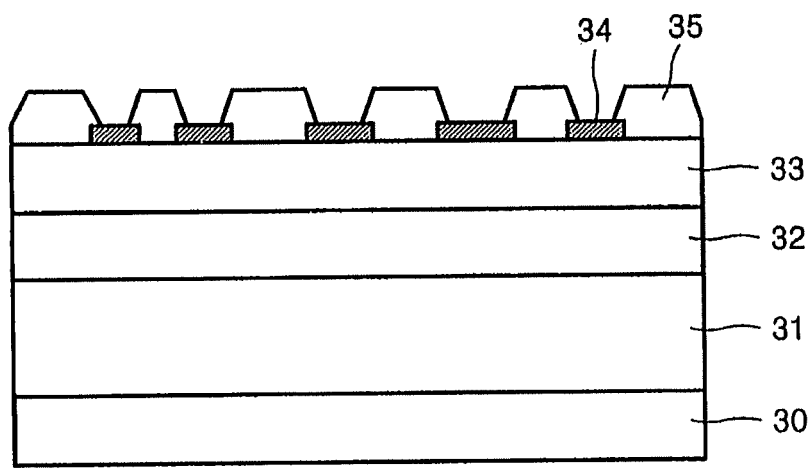
FIG. 3B is a cross-sectional view of the structure of the nitride semiconductor LED for improving light extraction efficiency.

FIG. 3A is cross-sectional view of a nitride semiconductor LED according to an embodiment of the present invention, and FIG. 3B is a cross-sectional view of the structure of the nitride semiconductor LED for improving light extraction efficiency. Referring to FIGS. 3A and 3B, a first semiconductor layer 31, an active layer 32, and a second semiconductor layer 33 are sequentially formed on a substrate 30. A mask layer 34 is formed on a region of the second semiconductor layer 33. A third semiconductor layer 35 is formed on a region of the second semiconductor layer 33 in which the mask layer 34 is not formed. Also, a transparent electrode 36 is formed on the third semiconductor layer 35, and a first electrode is formed on the transparent electrode 36. A second electrode 38 is formed on the first semiconductor layer 31 on which the active layer 32 is not formed.

Here, if the first semiconductor layer 31 is formed of a p-type semiconductor material, the second semiconductor layer 33 and the third semiconductor layer 35 are formed of an n-type semiconductor material. Also, if the first semiconductor layer 31 is formed of an n-type semiconductor material, the second semiconductor layer 33 and the third semiconductor layer 35 are formed of a p-type semiconductor material. The first semiconductor layer 31, the active layer 32, the second semiconductor layer 33, and the third semiconductor layer 35 may all be formed of a nitride semiconductor material. The mask layer 34 is formed of nitride silicon having a chemical formula $Si_xN_y$.

The third semiconductor layer 35 is formed on the second semiconductor layer 33 on which the mask layer 34 is not formed, and has a textured structure. In the case of the nitride semiconductor LED according to the present embodiment, the textured structure of the third semiconductor layer 35 can be formed by incorporating the mask layer 34, and can increase the extraction efficiency of light generated by the active layer of the semiconductor LED.

Hereinafter, a method of manufacturing a nitride semiconductor LED that can increase the light extraction efficiency according to an embodiment of the present invention will now be described with reference to FIGS. 4A through 4C.

Figure 4A:
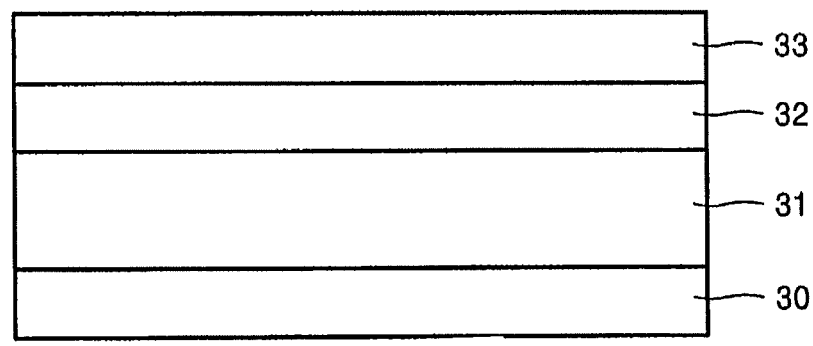
FIGS. 4A through 4C are cross-sectional views for explaining a method of manufacturing a nitride semiconductor LED according to an embodiment of the present invention.

Referring to FIG. 4A, a first semiconductor layer 31, an active layer 32, and a second semiconductor layer 33 are sequentially formed on a substrate 30. This structure can be formed using a conventional semiconductor manufacturing process, such as metalorganic chemical vapor deposition (MOCVD) or molecular beam epitaxy (MBE). In the MOCVD apparatus, on a substrate formed of GaSa, sapphire ($Al_2O_3$), SiC, or Si, n-GaN is deposited as the first semiconductor layer 31, InGaN is deposited as the active layer 32, and p-GaN is epitaxy deposited as the second semiconductor layer 33.

Figure 4B:
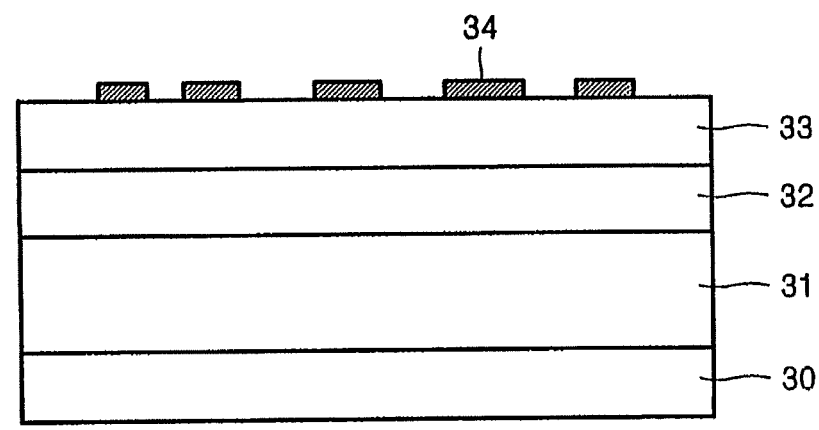

Referring to FIG. 4B, a mask layer 34 is formed on the second semiconductor layer 33. At this time, the mask layer 34 is not formed on the entire surface of the second semiconductor layer 33, but is formed in a region of the second semiconductor layer 33 in an island structure. The mask layer 34 is used as a device for forming the semiconductor LED of FIG. 4A, and is preferably formed of $Si_xN_y$. The mask layer 34 will now be described in detail.

After the second semiconductor layer 33 is formed in a reaction chamber of the MOCVD apparatus, raw materials of Si and N are added. For example, the raw material of Si can be silicon source such as triethylsilane (TESi), tributhy silane (TBSi), ditertiarybuthysilane (DTBSI) or silicon hydride sources such as silane ($SiH_4$), disilane ($Si_2H_6$). The raw material of N can be $NH_3$ (ammonia). When Si and N are added to the reaction chamber of the MOCVD apparatus, $SiN_x$ is produced. Here, the $Si_xN_y$ mask layer 34 is controlled to be formed in an island structure on regions of the second semiconductor layer 33 by controlling the amount of Si and N added to the reaction chamber of the MOCVD apparatus. The mask layer 34 is formed to a thickness in the range of from a few monolayers to 100 nm, which is very thin compared to the second semiconductor layer 33. Consequently, the mask layer 34 is formed in an island structure on the second semiconductor layer 33, and the second semiconductor layer 33 is exposed in the regions where the mask layer 34 is not formed. In other words, in the in-situ depositing of the mask layer, openings having irregular sizes and periods are formed in the mask layer, as described in FIG. 4D.

Figure 4C:
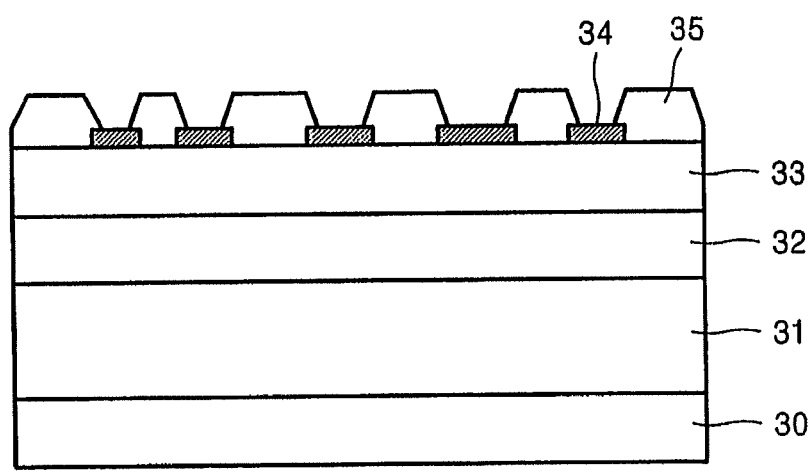

Referring to FIG. 4C, a third semiconductor layer 35 is deposited on the second semiconductor layer 33. Here, the third semiconductor layer 35 can be formed of the same material as the second semiconductor layer 33. For example, both the second semiconductor layer 33 and the third semiconductor layer 35 can be formed of p-GaN.

The third semiconductor layer 35 is only grown epitaxially on the second semiconductor layer 33, not on the mask layer 34. That is, the third semiconductor layer 35 grows in a preferential growth surface direction. As a result, as depicted in FIG. 4C, the third semiconductor layer 35 grows only on the second semiconductor layer 33, and not on the mask layer 34. Consequently, the third semiconductor layer 35 can be grown with a textured structure. The epitaxial growth preferentially progresses upward from the surface of the second semiconductor layer 33, and then progresses laterally above the mask layer 34. The manufacturing of a semiconductor LED can be completed when a transparent electrode 37 is formed on the third semiconductor layer 35.

Figure 1A:
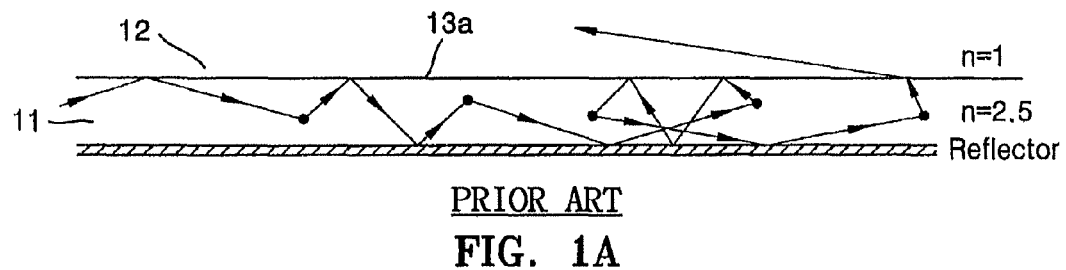
FIG. 1A is a schematic drawing illustrating the extraction of light at a flat interface of material layers having different refractive indexes.
Figure 1B:
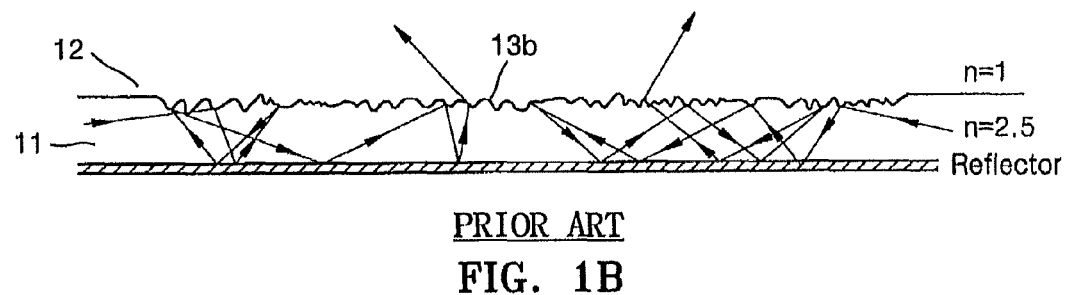
FIG. 1B is a schematic drawing illustrating the extraction of light at a textured structure interface of material layers having different refractive indexes.
Figure 2A:
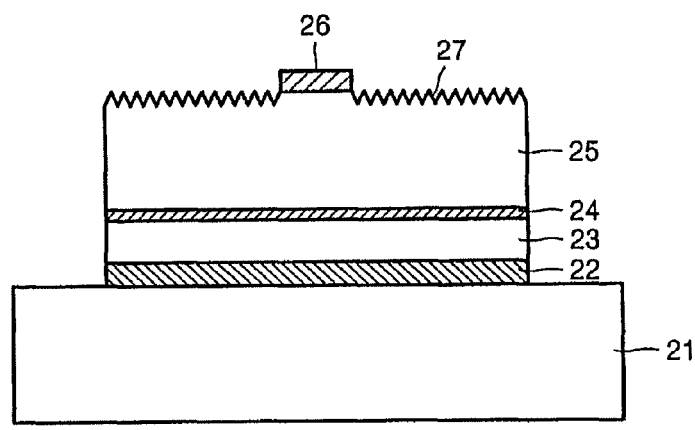
FIG. 2A is a cross-sectional view of a conventional nitride semiconductor LED having a textured structure.
Figure 2B:
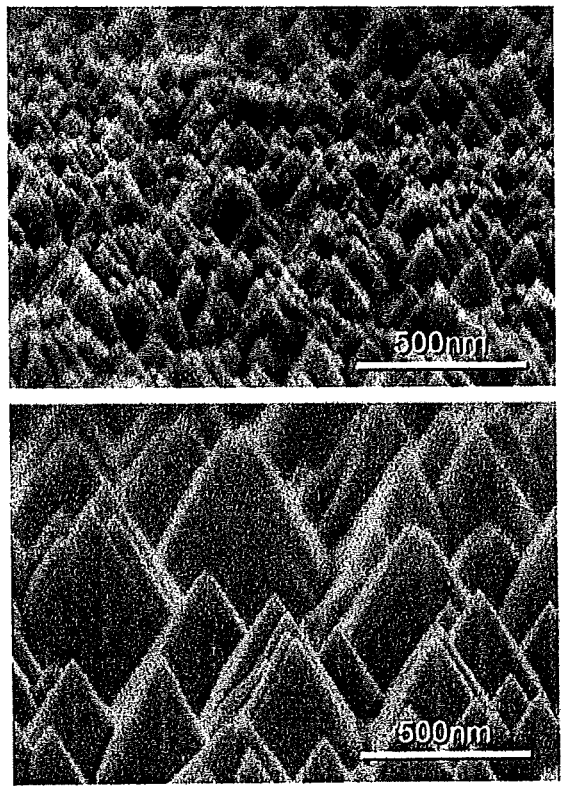
FIG. 2B is a SEM image of the textured structure.

The textured structure shown in FIG. 4C corresponds to the conventional textured structure shown in FIG. 2, and improves the extraction efficiency of light generated by the active layer. In the method of manufacturing the semiconductor LED with improved light extraction efficiency according to the present invention, the textured structure can be readily formed in one process apparatus without an additional etching process, by forming the Si.sub.xN.sub.y mask layer 34 on a region of the second semiconductor layer 33. Therefore, the light generated by the active layer can be extracted to the outside through the transparent electrode.

Figure 4D:
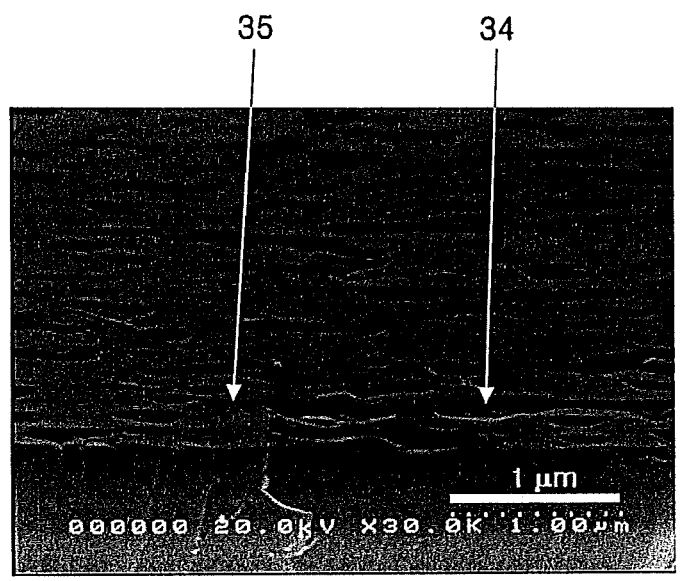
FIG. 4D is a SEM image of a textured structure manufactured by the process for forming the nitride semiconductor LED of FIGS. 4A through 4C.

FIG. 4D is a SEM image of a textured structure manufactured by the process for forming the nitride semiconductor LED of FIGS. 4A through 4C. Referring to FIG. 4D, the third semiconductor layer 35 is formed on the second semiconductor layer 33, and the mask layer 34 is formed on the second semiconductor layer 33.

According to the present invention, a semiconductor LED having a textured structure can be manufactured in one manufacturing apparatus by combining a process for manufacturing a semiconductor device epitaxial growth and a process for manufacturing the textured structure on a semiconductor layer, instead of a conventional method in which the process for manufacturing the semiconductor device epitaxial growth and the process for manufacturing the textured structure are separately performed.

While the present invention has been particularly shown and described with reference to exemplary embodiments thereof, it will be understood by those of ordinary skill in the art that various changes in form and detail may be made therein without departing from the spirit and scope of the present invention as defined by the following claims.

The invention claimed is:

1. A semiconductor light emitting diode comprising:
a first semiconductor layer;
an active layer formed on the first semiconductor layer;
a second semiconductor layer formed on the active layer:
a mask layer formed on the second semiconductor layer, the mask layer having a plurality of openings, and having a thickness thinner than that of the second semiconductor layer;
a third semiconductor layer, having a textured structure on an upper surface thereof, formed on a surface of the second semiconductor layer through the plurality of openings; and
a transparent electrode formed on the third semiconductor layer, having a textured structure on an upper surface thereof, and having a shape which corresponds to that of the textured structure of the third semiconductor layer,
wherein the first semiconductor layer is an n-type semiconductor layer and the second and third semiconductor layers are p-type semiconductor layers.

2. The semiconductor light emitting diode of claim 1, wherein the mask layer is formed of a material that comprises $Si_xN_y$.

3. The semiconductor light emitting diode of claim 1, wherein openings among the plurality of openings have irregular sizes and periods.

4. The semiconductor light emitting diode of claim 1, wherein the third semiconductor layer is made of the same material as that of the second semiconductor layer.

5. The semiconductor light emitting diode of claim 1, wherein light generated by the active layer is extracted to the outside through the transparent electrode.

6. The semiconductor light emitting diode of claim 1, wherein at least a portion of an upper surface of the mask layer is covered with the third semiconductor layer.

* * * * *